(12) United States Patent
Chai et al.

(10) Patent No.: US 6,385,071 B1
(45) Date of Patent: May 7, 2002

(54) REDUNDANT SCHEME FOR CAMRAM MEMORY ARRAY

(75) Inventors: Chiaming Chai, Durham; Jeffrey Herbert Fischer, Cary; Michael ThaiThanh Phan, Apex, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/861,828

(22) Filed: May 21, 2001

(51) Int. Cl.[7] .............................................. G11C 15/00
(52) U.S. Cl. ..................... 365/49; 365/200; 365/189.07
(58) Field of Search .............................. 365/49, 189.07, 365/200, 225.7

(56) References Cited

U.S. PATENT DOCUMENTS

| | | | |
|---|---|---|---|
| 3,633,175 A | 1/1972 | Harper | 340/172.5 |
| 5,088,066 A | 2/1992 | Castro | 365/230.06 |
| 5,319,589 A | 6/1994 | Yamagata et al. | 365/49 |
| 5,576,985 A | 11/1996 | Holtz | 365/49 |
| 5,666,482 A | 9/1997 | McClure | 395/182.06 |
| 5,675,543 A | 10/1997 | Rieger | 365/200 |
| 5,953,745 A | 9/1999 | Lattimore et al. | 711/162 |
| 5,958,068 A | 9/1999 | Arimilli et al. | 714/8 |
| 6,006,313 A | 12/1999 | Fukumoto | 711/211 |
| 6,023,746 A | 2/2000 | Arimilli et al. | 711/118 |
| 6,098,150 A | 8/2000 | Brethour et al. | 711/128 |
| 6,275,406 B1 * | 8/2001 | Gibson et al. | 365/49 |

OTHER PUBLICATIONS

IBM Technical Disclosure Bulletin, vol. 28, No. 6, entitled "System for Efficiently Using Spare Memory Components for Defect Corrections Employing Content–Addressable Memory", Nov., 1985.

* cited by examiner

*Primary Examiner*—Huan Hoang
(74) *Attorney, Agent, or Firm*—Patrick J. Daugherty; Driggs, Lucas, Brubaker & Hogg Co. LPA

(57) ABSTRACT

A content addressable memory (CAM) structure and method that provides a redundant scheme for an ASIC. The scheme comprises a CAM comparative means for bypassing normal encoders, including a fuse structure having a fuse address list and a "CAM row compare" structure. Redundancy is provided in "CAM Search Read" and "CAM Search Read and RAM Read" operations. Normal CAM memory address rows and redundant replacement CAM memory address rows are provided for bank addresses. A miss logic is provided for detecting a bank address miss and generating a responsive miss signal, and an "address out" logic is also provided to pass only one of a generated normal CAM memory address row, redundant replacement address row or miss signal in a bank. The method and structure can support different address sizes and different cache sizes.

18 Claims, 3 Drawing Sheets

REDUNDANT SCHEME FOR CAMRAM MEMORY ARRAY

BACKGROUND INFORMATION

A content addressable memory (CAM) may be described as a device in which a binary data input pattern is compared with stored data patterns to find a matching binary pattern. When the CAM detects such a match, it provides an address or location (called a match address). It is known in some system architectures for a CAM to scan a random address memory (RAM) cell to find the matching data pattern, and such a structure and method is known as a CAMRAM memory array.

The present invention relates to CAMRAM memory array structures, and in particular to CAMRAM's on Application Specific Integrated Circuit (ASIC) chip micro-controller processor cores. It is known to use CAM and RAM structures, singly or in combination, to provide a "redundancy function" in ASIC applications. A redundancy function may be utilized when a program driving the ASIC identifies defective row addresses. The redundancy function selects and provides a replacement row of good addresses, and a corrected matchline/wordline association is created.

ASIC applications are being designed with progressively increasing sizes of memory elements, but upon a progressively decreasing silicon device geometry, and accordingly more and more imperfect ASIC chips are produced. What is needed is a method and structure that will improve manufacturing yield while meeting the ASIC design demands. With the increasing size of memory elements, along with the requirement of faster access time and smaller available areas on ASIC chips, improved architecture of the CAMRAM base design is desired to address these issues effectively. What is also needed is a redundant scheme for a CAMRAM that will improve manufacturing yield and not result in any extra performance penalty in the operation of the ASIC.

SUMMARY OF THE INVENTION

A content addressable memory (CAM) structure and method that provides a redundant scheme for an ASIC. The scheme comprises a CAM comparative means for bypassing normal encoders including a fuse structure having a fuse address list and a "CAM row compare" structure. Redundancy is provided in "CAM Search Read" and "CAM Search Read and RAM Read" operations. Normal CAM memory address rows and redundant replacement CAM memory address rows are provided for bank addresses. A miss logic is provided for detecting a bank address miss and generating a responsive miss signal, and an "address out" logic is also provided to pass only one of a generated normal CAM memory address row, redundant replacement address row or miss signal in a bank. The method and structure can support different address sizes and different cache sizes, allowing user versatility in design and application. Accordingly, the present invention offers advantages in improved manufacturing yields, performance and portability.

DESCRIPTION OF A PREFERRED EMBODIMENT

This invention generally relates to semiconductor content addressable memory (CAM), and more particularly to a structure and method that provides a CAM redundant scheme for a CAMRAM within an ASIC. The CAM is paired with a RAM that stores information that is searchable by the CAM. The details of RAM and CAM interfaces are well known in the industry and form no part of the present invention, except to the extent that a CAM is utilized for the redundancy scheme.

Figure 1:
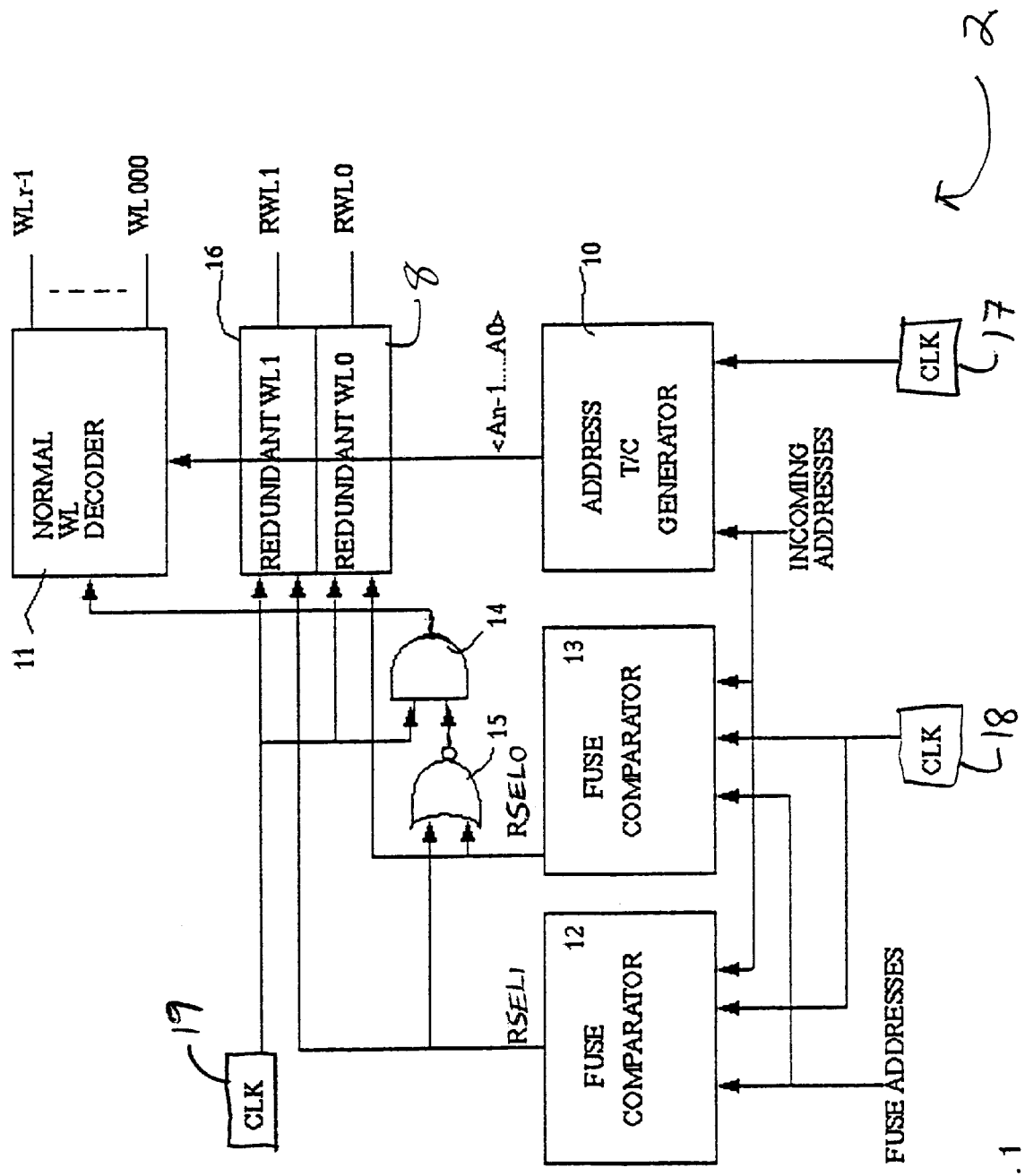
FIG. 1 is a block diagram of typical prior art RAM wordline redundancy implementation.

Referring now to the drawings and, for the present, to FIG. 1, a block diagram is provided showing a prior art ASIC RAM row or wordline redundancy structure 2 having two fuse comparators 12 and 13. The RAM redundancy structure 2 may be implemented in an ASIC structure during data read and write operations. Clock 17 gates an incoming address to the address T/C generator 10. The incoming address is compared to two lists of fuse addresses, one in each of two fuse comparators 12 and 13. If there is no match of the incoming address to either of the fuse address lists within the fuse comparators 12 or 13, then no redundant replacement has been determined and the prior art RAM structure 2 performs in "normal operation" mode. In normal operation mode address T/C generator 10 then generates an address $A_X$ and feeds it to the normal wordline decoder 11, thereby causing the normal wordline decoder 11 to select the corresponding word line $WL_X$. Address $A_X$ and wordline $WL_X$ are then passed out of the structure 2 to a RAM (not shown).

Alternatively, if either of fuse comparators 12 or 13 determines a match of the incoming address gated by Clock 18 with an address within their respective fuse list, then a redundant replacement has been determined and the prior art RAM structure 2 performs in "redundancy" mode. The use of fuse comparators for detecting defective memory address rows is well known, and a detailed description of these components is not believed to be necessary for one skilled in the art to practice the present invention. If the incoming address $A_X$ matches with a particular listed fuse address set $AF1_X$ on the fuse address list within fuse comparator 12, then address $A_X$ is identified as a defective row by fuse comparator 12, and fuse comparator 12 will select a correct redundant row address, RSEL1, and pass it to RWL1 decoder 16. Alternatively, if the incoming address $A_X$ matches with a particular listed fuse address set $AF0_X$ on the fuse address list within fuse comparator 13, then address $A_X$ is identified as a defective row by fuse comparator 13, and fuse comparator 13 will select a correct redundant row address, RSEL0, and pass it to RWL0 decoder 8. The fuse lists within fuse comparators 12 and 13 are mutually exclusive, so only one of RSEL0 and RSEL1 will have a redundant row address selection. Clock 19 then gates RSEL1 or RSEL0 out of the RWL decoder 16 or RWL decoder 8, respectively. RSEL1 or RSEL0 also passes through NOR gate 15, so if either is true then the NOR gate 15 passes a zero to AND gate 14. AND gate 14 also receives a clock 19 signal. It is readily apparent that when either RSEL1 or RSEL0 are high, fuse comparator 12 or 13 will generate RWL1 or RWL0 as high value, respectively, and the AND gate 14 will be set low, deselecting the normal decoder 11.

Figure 2:
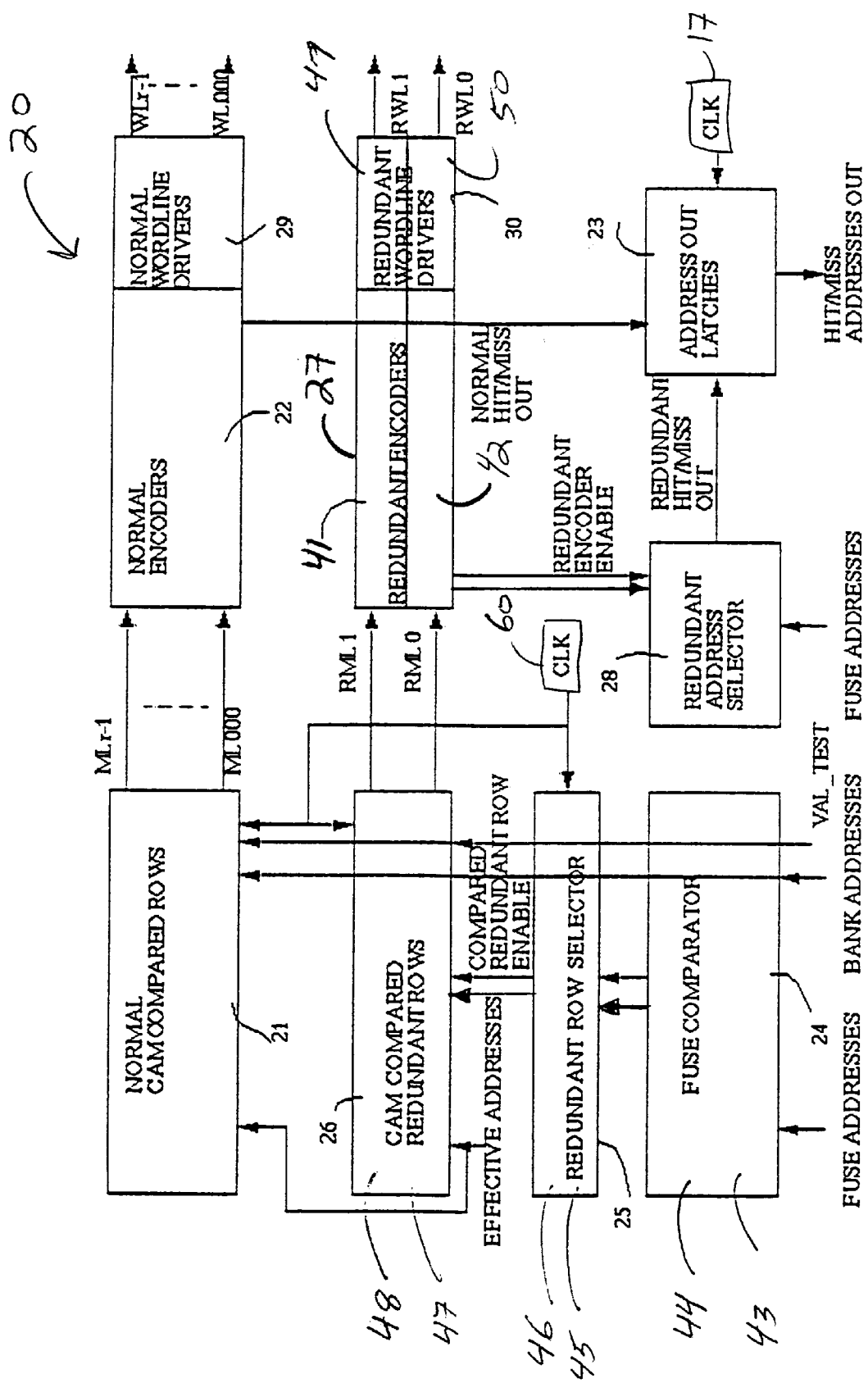
FIG. 2 is a block diagram showing a CAMRAM redundant scheme according to the invention.

Referring now to FIG. 2, a CAMRAM redundant scheme according to the present invention is provided. As is conventional in a CAMRAM design, there are a plurality of wordlines $WL_X$ and a plurality of match lines $ML_X$ which are configured to interface between the CAM and RAM memory elements (not shown). The embodiment shown is configured to operate with a cache unit (not shown), which is itself configured to select one of four 64-row memory banks for cache operations. It is to be understood that the present invention may be configured to operate with other cache units that may require access to more or less than four memory banks, and the memory banks may be a greater or lessor size than 64-row addresses. Similarly, although the present embodiment of the invention is configured to work with a cache unit, other applications or the present invention beyond cache units and operations will be readily apparent to one skilled in the art and the present invention is not restricted to cache unit operations and applications.

For purposes of the description of the present embodiment of the invention, a bank address is a block of memory that contains 64-row addresses within the CAMRAM memory array designated as available to the cache (not shown). Four banks (not shown) are available to the cache unit in the CAM redundancy scheme 20 of FIG. 2. During cache operations, the cache will select one of the four banks of memory addresses. The CAM redundancy scheme 20 will compare the effective address to the memory in the bank address or redundant address selected.

For the purposes of illustration, the embodiment of the present invention shown in FIGS. 2 and 3 will now be described in its application to two critical highly associative CAMRAM operations for a cache unit logic: (1) CAM Search Read and (2) CAM Search Read and RAM read. It is to be understood that the CAM redundancy scheme of the present invention may be used for other CAMRAM operations, as will be readily apparent to one skilled in the art, and accordingly the invention is not limited to the particular embodiments thus described.

CAM Search Read Operation

Referring now to FIG. 2, a CAM redundancy scheme 20 according to the present invention is shown. The CAM inputs a CAMRAM bank address into the CAM fuse comparator logic 24, which has been programmed with a list of defective CAMRAM memory bank addresses, also known as a fuse address list. The fuse comparator logic 24 compares the input bank address with the fuse address list. If the bank address does not match an address on the fuse address list, the CAM scheme 20 operates in "Normal mode." Alternatively, if the bank address does match an address on the fuse address list, the CAM scheme 20 operates in "Redundancy mode."

Normal mode operation: If the incoming bank address selected by the cache unit (not shown) does not match with a particular corresponding fuse address set in the fuse list in the fuse comparator logic 24, then the clock 60 will gate the incoming bank address and the effective address provided by the cache unit to the CAM memory cells associated with that bank address as normal CAM compared rows 21. The effective address will also select which associative memory bank of the compared rows 21 is enabled. If there is a match, one of the matchlines $ML_{OOO}$ to $ML_{r-1}$ will be set to logical 1. The logical $\alpha 1$ is then passed to and gates the corresponding dynamic encoders 22. Since this is a match, the encoders 22 will therefore return with the correct row addresses set and pass a miss signal at logic 0 to the address out latches bank 23, which will cause the latches bank 23 to latch out the correct row addresses. Alternatively, in case of a miss, all of the matchlines $ML_{OOO}$ to $ML_{r-1}$ stay at logical 0 and the encoder 22 will return to the address out latches bank 23 a miss signal at logical 1 and all other addresses to logical 0.

Redundancy mode operation: In contrast to the "Normal mode" described above, if the incoming bank address matches with a particular corresponding fuse address set in the fuse list in the fuse comparator logic 24, then the CAM Scheme 20 operates in "Redundancy mode" and the redundant row selector logic 25 will be enabled by the fuse comparator logic 24. Through comparison with the incoming bank address the redundant row selector logic 25 will select a correct CAM compared redundant row from the CAM memory cells labeled as CAM compared redundant rows 26. The memory bank thus selected from the CAM Compared Redundant Rows 26 will replace the defective CAM row in a corresponding associative bank. When a CAM redundant row is selected, its memory cells then get compared to the incoming effective addresses, and if there is a match, then either RML0 or RML1 will be set to logical 1. Alternatively, if there is a miss, then neither RML0 nor RML1 will be set high. In order to succeed this address comparison operation, there is a special Reset VAL_TEST signal which is gated to all the matchlines including a detected matchlines row, so that this signal will force all the matchlines to logical 0 or a miss during bring-up or reset cycle. "Bring-up" or "reset" cycles are well known to those skilled in the art, and accordingly a detailed description of their function or structure is not believed to be required to practice the present invention.

The embodiment of the invention shown in FIG. 2 is configured to work with a cache unit (not shown) accessing four 64-row addresses memory banks, it is preferred that two mutually exclusive redundant "logic sets" are utilized, wherein the fuse comparator logic 24, redundant row selector logic 25, CAM compared redundant rows 26, redundant encoders 27 and redundant wordline drivers 30 each have two separate elements that operate mutually exclusive of each other. Accordingly, fuse comparator logic 24 has two fuse comparators 43 and 44, each of which have a mutually exclusive fuse address list. If the incoming bank address matches the fuse comparator 43 fuse address list, then redundant row selector 45 and CAM compared redundant rows 47 are active and enabled, and RML1 will be set to logical 1, enabling redundant encoder 41 and redundant wordline driver 49. Alternatively, if the incoming bank address matches the fuse comparator 44 fuse address list, then redundant row selector 46 and CAM compared redundant rows 48 are active and enabled, and RML0 will be set to logical 1, enabling redundant encoder 42 and redundant wordline driver 50. The output of the redundant encoders 41 or 42 will determine what fuse address set is selected in redundant address selector 28, as will be described presently. The redundant address selector logic 28 will return with a correct row address set from the appropriate fuse address set, which is latched out by the address out latches bank 23. In case of a miss, RML0 or RML1 will stay at logical 0 and redundant address selector 28 then returns to the address out latches bank 23 with a miss at logical 1.

The number of mutually exclusive redundant logic sets is chosen based upon the probability of error, cache size, the number of address rows, and the desired size, speed and cost of the resultant structure. Accordingly, it is readily apparent that more or less than two redundant logic sets of fuse comparators, redundant row selectors, CAM compared redundant rows, redundant encoders and redundant wordline drivers may be utilized with the present invention, and the embodiment described herein is not to be construed as limiting the invention to only two redundant logic sets.

Figure 3:
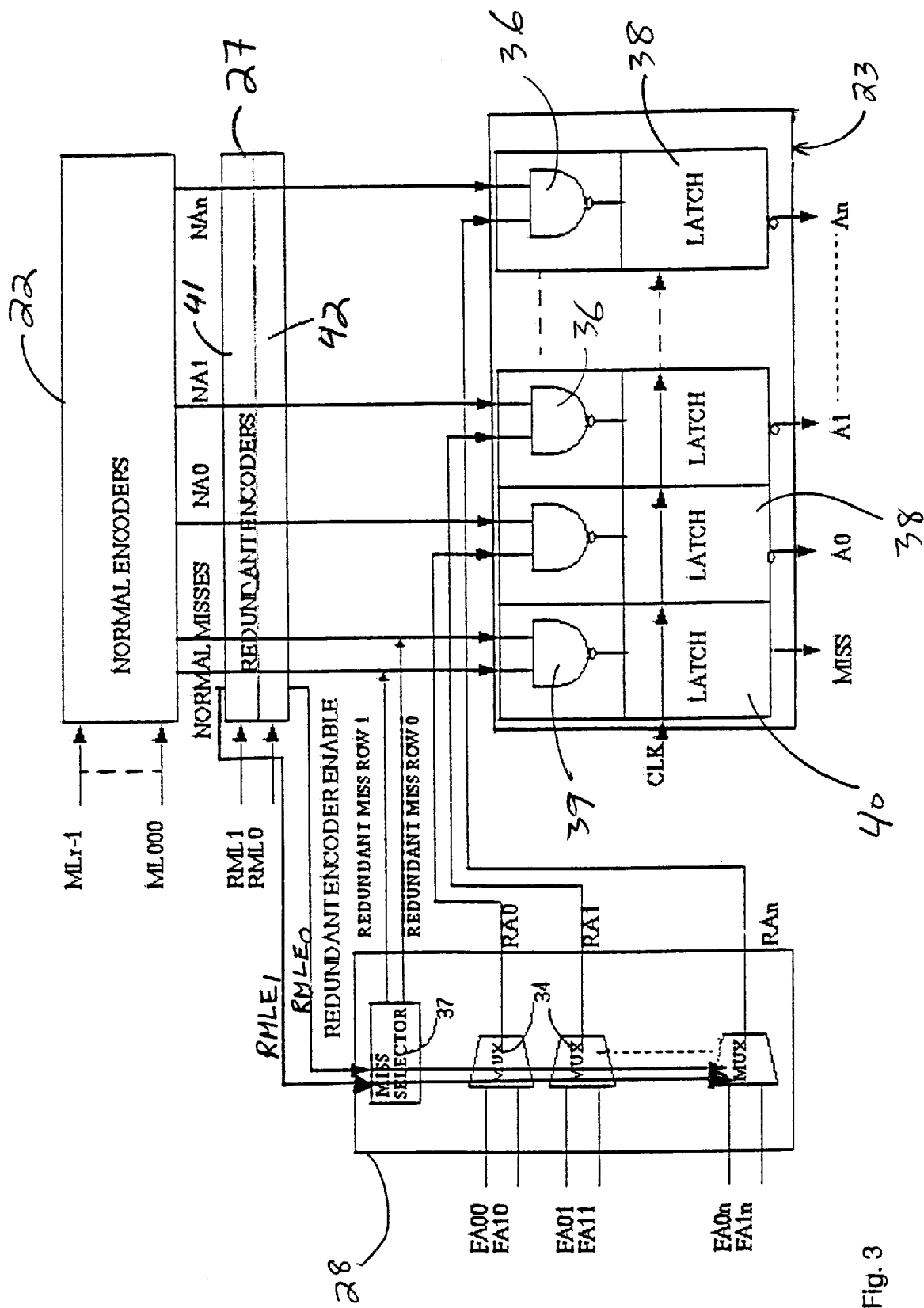
FIG. 3 is a detail block diagram showing a portion of circuitry of the CAMRAM redundant scheme of FIG. 2.

Referring now to FIG. 3, a portion of the CAM scheme 20 of FIG. 2 is shown with more detail. In particular, more detail is provided on how the CAM scheme redundant circuitry bypasses the normal encoder 22, so that the redundant row encoders 41 or 42 return with a correct replacement of a defective row address with a selected fuse address. If there is a match to a fuse address corresponding to redundant encoder 41, then RML0 is set high. Alternatively, if there is a match to a fuse address corresponding to redundant encoder 42, then RML1 is set high. Since only one of RML0 and RML1 is set high, therefore one of the redundant encoders 41 or 42 respectively returns with a "mutual exclusive redundant encoder enable" signal. They are mutually exclusive in that only one of RMLE0 and RMLE1 can be high at any one time. The mutual exclusive redundant encoder enable signal RMLE0 or RMLE1 will get fed to the control signals portion of the miss selector 37 and muxes 34, so that a correct fuse addresses set and misses are selected.

The number of muxes 34 and corresponding NAND gates 36 and latches 38 is determined by the cache unit requirements. For example, in the present embodiment the cache unit (not shown) accesses four 64-row bank addresses, and accordingly six muxes 34 and corresponding NAND gates 36 and latches 38 are required, and therefore n=5 in FIG. 3. It is readily apparent that the present invention may be practiced with more or less muxes 34 and corresponding NAND gates 36 and latches 38, and the number required will be determined by the cache unit or other device utilizing the CAMRAM redundant scheme 20. Since either RMLE0 or RMLE1 is high, a fuse addresses set is selected by the muxes 34: either one of FA00 through FA0n, or one of FA10 through FA1n, and the corresponding redundant miss row 1 or redundant miss row 0 is set to logical 0. Then each of the redundant address (RA0, RA1, . . . , RAn) outputs of the muxes 34 are each sent to a corresponding NAND gate 36 within each of the latches 38 in the address out latches bank 23, where they are NANDed with the normal encoder addresses (NA0, NA1, . . . NAn) from the normal encoders 31. The redundant miss row 0 and row 1 outputs of the miss selector 37 are dynamically dotted with the normal miss signals and NANDed together in the NAND gate 39 of the miss latch 40. By this means there will always be one miss signal staying at logical 0 during a fuse address match. And as described above, all the matchlines ML000 to MLr−1 are at logic 0, which causes the normal encoders 22 to set all outputs NA0, NA1 . . . NAn to logical 1, and the normal miss signal to logical 1. Since all RA0, RA1, . . . RAn are NANDed with logical 1 and the mutual exclusive misses are also NANDed together, therefore a correct set of addresses are selected and latched through non-inverted latches 38 to their proper values A0, A1, . . . An, and a miss is passed through inverted latch 40 at logical 0.

In case of no entry matches including redundancy, then RMLE1 and RMLE0 will be at logical 0. When RMLE1 and RMLE0 are at logical 0, no fuse address set is selected in the muxes 34 and miss selector 37, and the mux 34 internal logic will force RA0, RA1 . . . ,RAn to logical 1, and the miss selector 37 internal logic will force Redundant Miss Row 0 and Row 1 to logical 1. Also, the normal encoder addresses NA0, NA1 , . . . , NAn and normal misses will be set to logical 1. From this point the CAM scheme 20 behaves like the normal CAM Miss operation described above. Accordingly, the output of addresses A0, A1,. . . , An of the non-inverted latches 38 is at logical 0 and the miss output of inverted latch 40 is at logical 1.

It will be readily apparent to one skilled in the art that the Cam redundancy scheme of the present invention also takes the redundancy function out of the critical path for both CAM search Read and CAM Search Read and RAM Read operations, therefore there is no extra delay penalty imposed upon the ASIC processing during this operation. With the normal encoder bypass technique according to the present invention there is no need for additional specialized circuitry on the ASIC for the detection or bank address errors and generation of correct row addresses, and therefore the present invention is efficient in terms of space requirements on the ASIC, and in terms of power requirements for operation of the ASIC utilizing the present invention.

CAM Search Read and RAM Read Operation

This operation is very much similar to the CAM search operation described above, with an additional RAM read operation. Specifically, if there is a fuse address match, the CAMRAM control logic (not shown) will allow the CAM address to access the associative RAM data from the RAM (not shown) and present the data back to the cache unit logic (not shown). This is done so through normal wordline drivers 29 during normal operation, and redundant wordline drivers 30 when redundancy is enabled.

Accordingly, the preferred embodiment of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A dual mode CAM logic redundant scheme for an ASIC, comprising:
   a plurality of banks of normal CAM memory address rows;
   a normal encoder logic, configured to encode a normal CAM memory address row;
   a plurality of redundant replacement CAM memory address rows;
   a redundant encoder logic, configured to enable the CAM to bypass the normal encoder logic and encode a redundant CAM memory address row;
   a CAM fuse comparator logic having a fuse address list, configured to receive a bank address request having a plurality of bits, compare said bank address request to the fuse address list, and choose a normal CAM memory address row or request a redundant CAM memory address row responsive to said comparison;
   a redundant replacement CAM memory address selector logic, configured to assign a redundant replacement CAM memory address for each of said bank address request bits responsive to said CAM fuse comparator logic redundant CAM memory address row request and thereby provide a redundant replacement CAM memory address row; and
   an address out logic, configured to pass only one of said normal CAM memory address row and said redundant replacement CAM memory address row.

2. The dual mode CAM logic redundant scheme of claim 1, further comprising:
   a normal wordline driver logic configured to produce a wordline corresponding to said encoded normal CAM memory address row; and
   a redundant wordline driver logic configured to produce a wordline corresponding to said encoded redundant CAM memory address row.

3. The CAM logic redundant scheme of claim 1, further comprising a miss logic for detecting a bank address miss and generating a responsive miss signal, and wherein said address out logic is further configured to pass only one of said normal CAM memory address row, said redundant replacement CAM memory address row and said miss signal.

4. The CAM logic redundant scheme of claim 3 wherein the redundant encoder logic further comprises at least one redundant encoder, and wherein the CAM fuse comparator logic enables the at least one redundant encoder by matching the incoming bank address to an address of the fuse address list.

5. The CAM logic redundant scheme of claim 3 wherein the redundant encoder logic further comprises a pair of mutually exclusive redundant encoders, and wherein the CAM fuse comparator logic chooses one of the redundant encoders by matching the incoming bank address to an address of the fuse address list, each address on the fuse address list designating only one of the redundant encoders.

6. The CAM logic redundant scheme of claim 5 wherein the miss logic comprises a miss selector and a miss latch, wherein the miss selector is configured to generate a miss output responsive to the redundant encoders, said miss output is dynamically dotted with a normal encoder logic miss signal line output, and said miss latch generates a miss signal responsive to said dynamically dotted miss selector output and normal encoder logic miss signal line output.

7. The CAM logic redundant scheme of claim 5 wherein the redundant replacement CAM memory address selector logic has a plurality of mux switches, each of said mux switches dedicated to one bit of said replacement row address, and wherein each of said mux switch selects a replacement row address responsive to the redundant encoder selected by said CAM fuse comparator logic.

8. The CAM logic redundant scheme of claim 7 wherein each of the mux switches has a corresponding latch.

9. The CAM logic redundant scheme of claim 8 wherein each of the latches is configured to receive an address input from its corresponding mux switch and an address input from the normal encoder logic, and wherein said mux switches will pass an address output if only one of said mux switches and said normal encoder logic inputs are received.

10. A method for a dual mode CAM logic redundant scheme for an ASIC, comprising the steps of:
    providing a plurality of banks of normal CAM memory address rows;
    providing a normal CAM encoder logic;
    configuring the normal CAM encoder logic to encode a normal CAM memory address row;
    providing a plurality of redundant replacement CAM memory address rows;
    providing a redundant CAM encoder logic;
    configuring the redundant CAM encoder logic to encode a redundant CAM memory address row;
    providing a CAM fuse comparator logic having a fuse address list;
    configuring the CAM fuse comparator logic to receive a bank address request having a plurality of bits;
    receiving a bank address request into the CAM fuse comparator logic;
    the fuse comparator logic comparing said bank address request to the fuse address list;
    if the bank address is not on the fuse address list, the fuse comparator logic choosing a normal CAM memory address row responsive to said comparison and encoding the address row with said normal encoder logic;
    if the bank address is on the fuse address list, the fuse comparator requesting a redundant CAM memory address row responsive to said comparison, the CAM bypassing the normal encoder logic and encoding the redundant address row with said redundant CAM encoder logic;
    providing a redundant replacement CAM memory address selector logic for receiving a redundant CAM memory address row request from said fuse comparator and, when said request is received, assigning a redundant replacement CAM memory address for each of said bank address request bits responsive to said request and thereby providing a redundant replacement CAM memory address row; and
    providing an address out logic configured to receive a passed normal CAM memory address row and a redundant replacement CAM memory address row and pass only one of said normal CAM memory address row and said redundant replacement CAM memory address row inputs;
    the address out logic passing either a normal CAM memory address row or a redundant replacement CAM memory address row.

11. The method of claim 10, further comprising the steps of:
    providing a CAM normal wordline driver logic;
    configuring the normal wordline driver logic to produce a wordline corresponding to said encoded normal CAM memory address row;
    providing a redundant wordline driver logic; and
    configuring the redundant wordline driver logic to produce a wordline corresponding to said encoded redundant CAM memory address row.

12. The method of claim 10 further comprising the following steps:
    providing a CAM miss logic for detecting a bank address miss; and
    the CAM miss logic generating a miss signal responsive to detecting a bank address miss, said miss signal passed to the address out logic;
    the address out logic passing only one of said normal CAM memory address row, said redundant replacement CAM memory address row and said miss signal.

13. The method of claim 12 wherein the step of providing the redundant encoder logic further comprises providing at least one redundant encoder;
    further providing the step of the CAM fuse comparator logic enabling the at least one redundant encoder by matching the incoming bank address to an address of the fuse address list.

14. The method of claim 12 wherein the step of providing the redundant encoder logic further comprises providing a pair of mutually exclusive redundant encoders;
    further providing the step of the CAM fuse comparator logic choosing one of the redundant encoders by matching the incoming bank address to an address of the fuse address list, each address on the fuse address list designating only one of the redundant encoders.

15. The method of claim 14 wherein the step of providing a miss logic further comprises providing a miss selector configured to generate a miss output responsive to the redundant encoders and a miss latch, and further comprising the steps of:
    providing a normal encoder logic miss signal line output;
    dynamically dotting the miss output with the normal encoder logic miss signal line output; and
    the miss latch generating a miss signal responsive to said dynamically dotted miss selector output and normal encoder logic miss signal line output.

16. The method of claim 14, having the step of providing a redundant replacement CAM memory address selector logic, further comprising the step of providing a plurality of mux switches, each of said mux switches dedicated to one bit of said replacement row address; and said mux switches selecting a replacement row address responsive to the redundant encoder selected by said CAM fuse comparator logic.

17. The method of claim 16, further comprising the step of providing a latch for each mux switch.

18. The method of claim 17, further comprising the steps of:

configuring each of the latches to receive an address input from its corresponding mux switch and an address input from the normal encoder logic; and said mux switches passing an address output if only one of said mux switches and said normal encoder logic inputs are received.

* * * * *